US006515611B1

United States Patent
Fetterman et al.

(10) Patent No.: US 6,515,611 B1
(45) Date of Patent: Feb. 4, 2003

(54) MULTISTAGE ANALOG-TO-DIGITAL CONVERTER WITH AMPLIFIER COMPONENT SWAPPING FOR IMPROVED LINEARITY

(75) Inventors: H. Scott Fetterman, New Tripoli, PA (US); Yalin Ren, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/993,846

(22) Filed: Nov. 6, 2001

(51) Int. Cl.$^7$ ................................................ H03M 1/38
(52) U.S. Cl. ..................... 341/161; 341/162; 341/172
(58) Field of Search ................................ 341/155, 156, 341/161, 172, 150, 122, 120, 131

(56) References Cited

U.S. PATENT DOCUMENTS

| | | | | |
|---|---|---|---|---|
| 5,416,485 A | * | 5/1995 | Lee ............................ | 341/172 |
| 5,635,937 A | * | 6/1997 | Lim et al. .................... | 341/161 |
| 5,764,176 A | * | 6/1998 | Ginetti ........................ | 341/161 |
| 5,771,012 A | * | 6/1998 | Shu et al. .................... | 341/118 |
| 6,137,431 A | * | 10/2000 | Lee et al. .................... | 341/161 |
| 6,172,629 B1 | | 1/2001 | Fetterman | |
| 6,295,016 B1 | * | 9/2001 | Chiang ........................ | 341/161 |

OTHER PUBLICATIONS

P.C. Yu et al., "A 14b 40MSample/s Pipelined ADC with DFCA," IEEE International Solid–State Circuits Conference, pp. 136–137, 2001.
Y. Ren, "High Resolution High Speed Pipelined Analog-to-Digital Converter Design," Master Thesis, University of Waterloo, Waterloo, Ontario, Canada, 118 pages, 1998.

* cited by examiner

Primary Examiner—Brian Young
Assistant Examiner—John Nguyen
(74) Attorney, Agent, or Firm—Ryan, Mason & Lewis, LLP

(57) ABSTRACT

A multistage analog-to-digital converter (ADC) having improved linearity is disclosed. The ADC in an illustrative embodiment includes a sampling circuit and a plurality of stages. A first one of the stages receives a sampled analog input signal from the sampling circuit, and each of the stages operates to generate an output corresponding to one or more bits of a digital output signal representative of the analog input signal. Each of at least a subset of the stages has associated therewith at least one amplifier circuit, e.g., an output analog residue amplifier, having at least one sampling component and at least one feedback component. The sampling component and the feedback component are periodically swapped to reduce gain error between one or more of the stages so as to provide improved linearity for the ADC.

20 Claims, 4 Drawing Sheets

MULTISTAGE ANALOG-TO-DIGITAL CONVERTER WITH AMPLIFIER COMPONENT SWAPPING FOR IMPROVED LINEARITY

FIELD OF THE INVENTION

The present invention relates generally to multistage analog-to-digital converters (ADCs), and more particularly to techniques for improving the linearity of such circuits.

BACKGROUND OF THE INVENTION

Analog-to-digital converters (ADCs) convert an analog input signal into a corresponding digital output signal. ADCs are often configured as multistage circuits, with each stage determining one or more bits of the digital output signal. The first stage of such a multistage ADC receives a sampled representation of the analog input signal and provides an output representing one or more bits of the digital output signal. The first stage also generates a so-called "residue" which is supplied to the second stage. The second stage utilizes the residue received from the first stage to provide an output representing one or more additional bits of the digital output signal. Similarly, each of the remaining stages other than the final stage generates a residue for use by a subsequent stage. Each stage of a multistage ADC may produce more bits than the output of that stage represents in the digital output signal, thereby providing information redundancy for use in error correction. A digital error correction circuit within the multistage ADC receives the bits generated by each stage, applies the error correction, and generates the digital output signal.

It is well known that pipelining may be applied to a multistage ADC in order to provide an increased throughput. For example, the multiple stages may be configured to utilize parallel processing, at the cost of an initial latency as required to fill the pipeline. A multistage ADC which implements pipelining is referred to herein as a pipelined ADC.

Techniques for reducing non-linearity in a multistage ADC without adversely affecting dynamic range are disclosed in U.S. Pat. No. 6,172,629, issued Jan. 9, 2001 in the name of inventor H. Scott Fetterman and entitled "Multistage analog-to-digital converter employing dither," which is incorporated by reference herein. An illustrative embodiment described in U.S. Pat. No. 6,172,629 utilizes a slicing circuit adapted to slice a signal into a number of different levels based on a selected threshold, and employs dither to vary at least one slicing level in the slicing circuit. As a result, spurious tones are reduced in magnitude and spread out in frequency, and substantially the entire frequency range of the ADC is available for signal bandwidth.

Despite the considerable advantages provided by the techniques disclosed in U.S. Pat. No. 6,172,629, a need remains for further improvements in reducing the non-linearity of a multistage ADC. For example, improved techniques are particularly desirable in applications involving high input levels and significant amounts of component mismatch.

SUMMARY OF THE INVENTION

The present invention provides an improved multistage analog-to-digital converter (ADC) and associated method.

In accordance with one aspect of the invention, the ADC includes a sampling circuit and a plurality of stages. A first one of the stages receives a sampled analog input signal from the sampling circuit, and each of the stages operates to generate an output corresponding to one or more bits of a digital output signal representative of the analog input signal. Each of at least a subset of the stages has associated therewith at least one amplifier circuit, e.g., an output analog residue amplifier, having at least one sampling component and at least one feedback component. The sampling component and the feedback component are periodically swapped to reduce gain error between one or more of the stages, thereby providing improved linearity for the ADC.

In an illustrative embodiment of the invention, the sampling component and the feedback component are periodically swapped by randomly selecting at each of a number of points in time a particular one of two available components for utilization as one of the sampling component and the feedback component, with the other of the two available components being the other of the sampling component and the feedback component.

Advantageously, the invention provides reduced non-linearity and hence improved spurious free dynamic range (SFDR) for a multistage ADC. More specifically, the invention in the illustrative embodiment can be used to achieve a non-linearity on the order of 14 bits, which corresponds to approximately 0.03%. The improvements in SFDR are particularly significant for high input levels and in the presence of substantial component mismatch. In addition, the invention can be used to greatly reduce the size of the sampling and feedback capacitors required in a given ADC implementation, which in turn improves conversion speed and reduces silicon area. The invention can be implemented in a wide variety of multistage ADC architectures, regardless of operating frequency.

DETAILED DESCRIPTION OF THE INVENTION

The present invention will be illustrated using an example N-bit pipelined analog-to-digital converter (ADC) architecture in which N−1 pipelined stages are used to convert an analog input signal into an N-bit digital output signal. It should be understood, however, that the particular ADC architecture used to illustrate the invention is by way of example only. Those skilled in the art will recognize that the invention can be implemented in a wide variety of other types of ADC architectures, such as, for example, ADCs which have different numbers of stages, stages generating different numbers of bits, or collectively provide a different size digital output signal than the ADC in the illustrative embodiment described herein. It should also be noted than an ADC in accordance with the invention may be implemented as a stand-alone converter or may be a portion of an integrated circuit, e.g., a microprocessor, microcontroller, digital signal processor (DSP), codec, radio, or other mixed signal integrated circuit.

Figure 1:
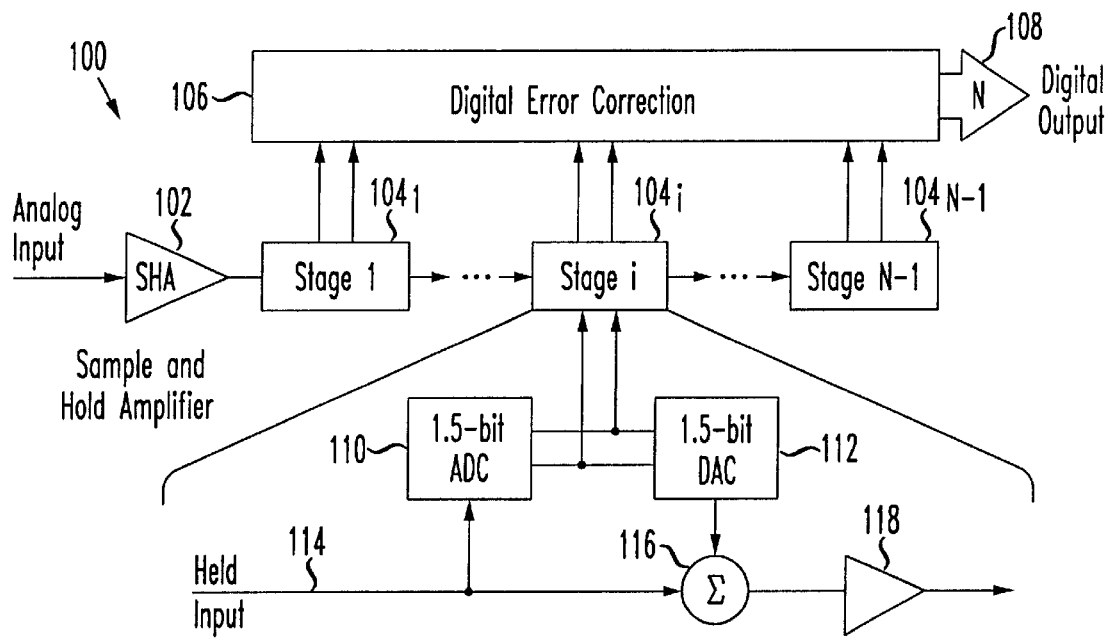
FIG. 1 is a block diagram of an N-bit multistage analog-to-digital converter (ADC) in which the present invention may be implemented.

FIG. 1 shows an N-bit pipelined ADC 100 in which the present invention may be implemented. The ADC 100 includes a sample-and-hold amplifier 102, N−1 stages 104$_1$ through 104$_{N-1}$, and a digital error correction circuit 106. The ADC 100 processes an analog input signal applied to sample-and-hold amplifier 102 in order to generate an N-bit digital output signal 108. Each of the stages 104$_1$, through 104$_{N-2}$ in this embodiment yield 1.5 bits of information, with stage 104$_{N-1}$ yielding two bits of information, all of which is supplied to the error correction circuit 106. Each of the stages 104$_1$ through 104$_{N-2}$ thus produce a half-bit of extra or redundant information. This redundant information is utilized by the error correction circuit 106 in a conventional manner in generating the N-bit digital output signal 108.

Figure 2:
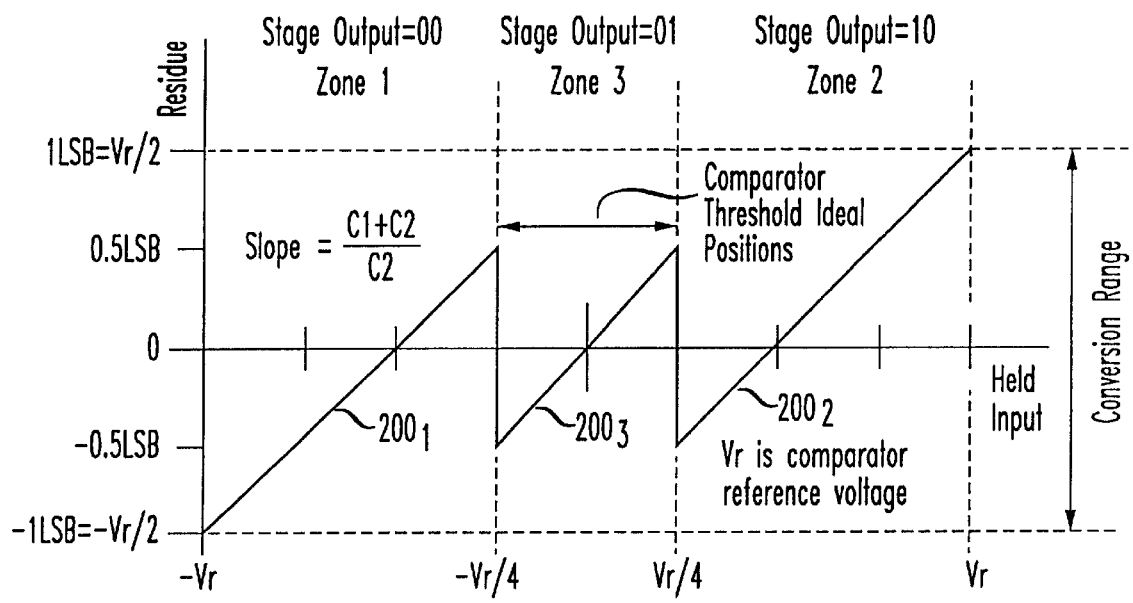
FIG. 2 is a diagram illustrating inter-stage residue as a function of stage input for a given stage of the multistage ADC of FIG. 1 in a theoretical ideal case with no mismatch between sampling and feedback capacitors in an output amplifier of the given stage.

FIG. 2 is a diagram illustrating inter-stage residue as a function of stage input for a given stage of the multistage ADC of FIG. 1 in a theoretical ideal case with no mismatch between sampling and feedback capacitors in an output amplifier of the given stage.

The stages 104$_1$, through 104$_{N-2}$ each yield 1.5 bits of information by separating the analog voltage range of −Vr to +Vr into three separate zones, Zone 1, Zone 2 and Zone 3 as illustrated in FIG. 2, where Vr denotes the comparator reference voltage utilized in each of the stages. Depending on which zone a particular input analog voltage falls into, the stage 104$_1$ through 104$_{N-2}$ receiving that input analog voltage will generate a 1.5-bit output 00, 01 or 10 as indicated in FIG. 2. The stage 104$_1$ through 104$_{N-2}$ will also generate an analog residue indicated by the vertical axis of the FIG. 2 diagram. As is apparent from the diagram, the analog residue can take on a value from Vr/2 or one least significant bit (1LSB) to −Vr/2 or negative one least significant bit (−1LSB).

Referring again to FIG. 1, a more detailed view is shown of a given one of the stages, namely stage 104$_i$, which includes a 1.5-bit ADC 110 and a 1.5-bit digital-to-analog converter (DAC) 112. It should be understood that stages 104$_1$ through 104$_{N-2}$ are configured in a similar manner. Stage 104$_{N-1}$ in this illustrative embodiment will generally include only a two-bit ADC, since it need not generate a residue for a subsequent stage.

In the particular stage 104$_i$ as shown in FIG. 1, a held input 114, which corresponds to an analog residue output of a previous stage, assuming i≧2, is applied to an input of the 1.5 bit ADC 110 and to one input of a summing element 116. The 1.5 bit ADC converts the input analog residue to a 1.5-bit value, namely, either 00, 01 or 10, as indicated in FIG. 2, which is supplied to digital error correction circuit 106 and DAC 112. An analog residue is generated at the output of summing element 116. The analog residue is amplified by output amplifier 118, e.g., by a factor of two, and is then supplied as a held input to the subsequent stage 104$_{i-1}$.

The output amplifier 118 includes the above-noted sampling and feedback capacitors, arranged in a conventional manner well understood by those skilled in the art. As will be described in more detail below, the sampling and feedback capacitors are referred to herein as capacitors C1 and C2.

As mentioned above, FIG. 2 shows the inter-stage residue for a given one of the stages, e.g., stage 104$_i$, as a function of the held input from the previous stage. Stage 1 operates in substantially the same manner, but with the held input 114 corresponding to an output of the sample-and-hold amplifier 102 rather than a residue output from a previous stage as in stages 104$_2$ through 104$_{N-1}$.

The 1.5-bit ADC 110 in the stage 104$_i$ generally includes an upper comparator and a lower comparator, for establishing which of the above-noted three zones the held input falls into. The comparator thresholds are shown in FIG. 2 in their ideal positions, i.e., the upper comparator has its threshold set at +Vr/4 and the lower comparator has its threshold set at −Vr/4. These two comparators divide the held input range of −Vr to +Vr into the three zones denoted Zone 1, Zone 2 and Zone 3 as previously described.

The 1.5-bit DAC 112 is controlled by the 1.5-bit digital output of the ADC 110, and generates in response thereto an analog output comprising one of three analog reference levels, i.e., +Vr/2, 0, and −Vr/2. The analog output of the DAC 112 is applied to an input of the summing element 116 and summed therein with the input analog residue corresponding to held input 114. As indicated previously, the output of the summing element is 116 is amplified in amplifier 118, preferably by a factor of two, and held at that level for the subsequent stage to process.

If the held input applied to stage 104$_i$ is below the lower comparator threshold, i.e., within Zone 1, the analog output of the DAC 112 is +Vr/2, which is +1LSB relative to that stage and serves to keep the analog residue at the output of the stage 104$_i$ within the linear range of the 1.5-bit ADC of the subsequent stage. Similarly, if the held input applied to stage 104$_i$ is above the upper comparator threshold, i.e., within Zone 2, the analog output of the DAC 112 is −Vr/2, which is −1LSB relative to that stage. Finally, if the held input is between the lower and upper comparator thresholds, i.e., within Zone 3, the analog output of the DAC 112 is zero since no shift or offset is needed to keep the resulting analog residue within the linear range of the 1.5-bit ADC of the subsequent stage.

The slope of each of the lines 200$_1$, 200$_2$ and 200$_3$ in FIG. 2 is a function of capacitor matching and is given by:

$$\frac{C1 + C2}{C2},$$

where, as noted previously, C1 denotes a sampling capacitor and C2 denotes a feedback capacitor, both associated with the output amplifier 118 of the given stage 104$_i$. More particularly, the inter-stage gain in the illustrative embodiment is given by:

$$\frac{C1}{C2} + \frac{C2}{C2} = \frac{C1 + C2}{C2}.$$

Therefore, where C1 and C2 are equal in the theoretical ideal case, the amplifier 118 is a factor-of-two gain stage.

As indicated above, the FIG. 2 diagram corresponds to a theoretical ideal case with no mismatch between the sampling and feedback capacitors. It can be seen that the slope of each of the lines $200_1$, $200_2$ and $200_3$ is linear in this ideal case. However, in practical implementations of the ADC 100, there is a certain amount of mismatch between the sampling and feedback capacitors, and this mismatch is a primary source of ADC non-linearity.

Figure 3:
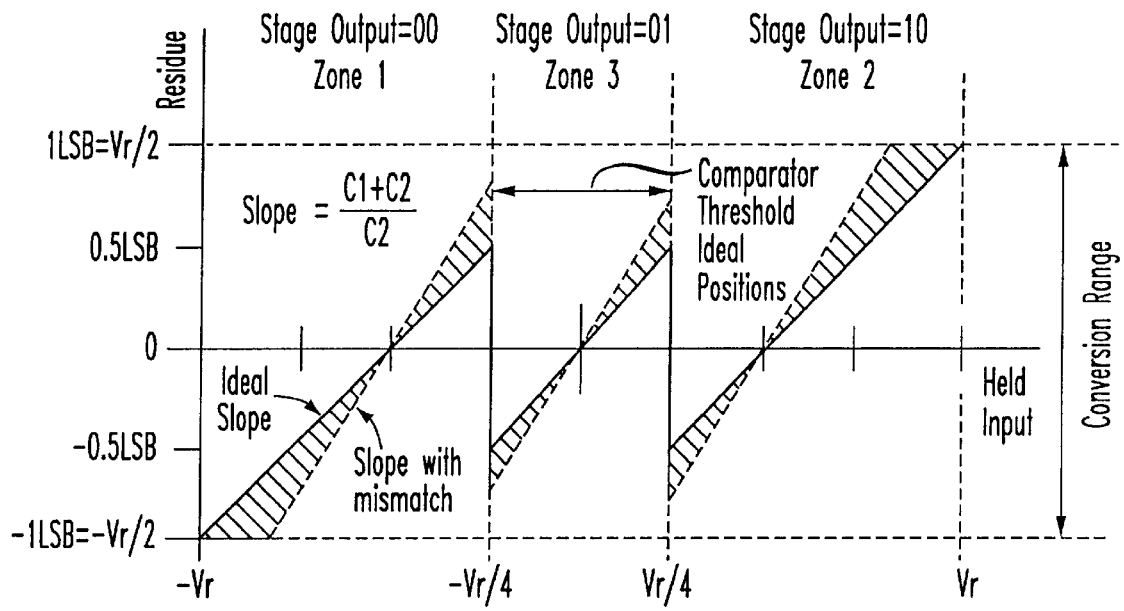
FIG. 3 is a diagram illustrating inter-stage residue as a function of stage input for a given stage of the multistage ADC of FIG. 1, with mismatch between sampling and feedback capacitors in the output amplifier of the given stage.

FIG. 3 is similar to FIG. 2 but illustrates a case in which there is variation in the above-noted ideal slope, attributable to mismatch between the sampling and feedback capacitors of the output amplifier 118. In this case, the slope may be given by:

$$\frac{(C1 + \Delta1) + (C2 + \Delta2)}{(C2 + \Delta2)},$$

where again C1 denotes a sampling capacitor and C2 denotes a feedback capacitor, both associated with the output amplifier 118 of the given stage $104_i$. The values $\Delta1$ and $\Delta2$ denote variation in the values of the respective capacitors C1 and C2. This variation gives rise to a significant amount of inter-stage gain error, which translates into undesirable non-linearity of the ADC and thus introduces harmonics in the frequency spectrum. In modern sub-micron technology, the capacitor matching is generally no better than about 11 bits, which corresponds to a mismatch of $2^{-12}=1/4096=2.441\times10^{-4}=0.024\%$. Moreover, if smaller capacitor size is used to achieve high speed, the matching of C1 and C2 can become even worse. The present invention recognizes that in order to achieve linearity performance better than that associated with 11 bit capacitor matching, the above-described inter-stage gain error has to be corrected.

In accordance with the invention, the inter-stage gain error is substantially reduced and linearity is thereby improved in a multistage ADC such as ADC 100 of FIG. 1 by randomly switching the sampling and feedback capacitors in the output amplifier of one or more stages of the ADC. More particularly, since the error is caused by capacitor mismatch in the manner described above, one of C1 or C2 of the output amplifier of a given stage is randomly selected as the sampling capacitor, with the other one serving as the feedback capacitor. This random selection is periodically repeated, such that the above-described gain error will tend to average out over time. The terms "periodic" or "periodically" should not be construed as requiring any particular regular, repeatable or otherwise identifiable period, but more generally refer to multiple repetitions over a number of different points in time that may or may not correspond to regular intervals.

Figure 4:
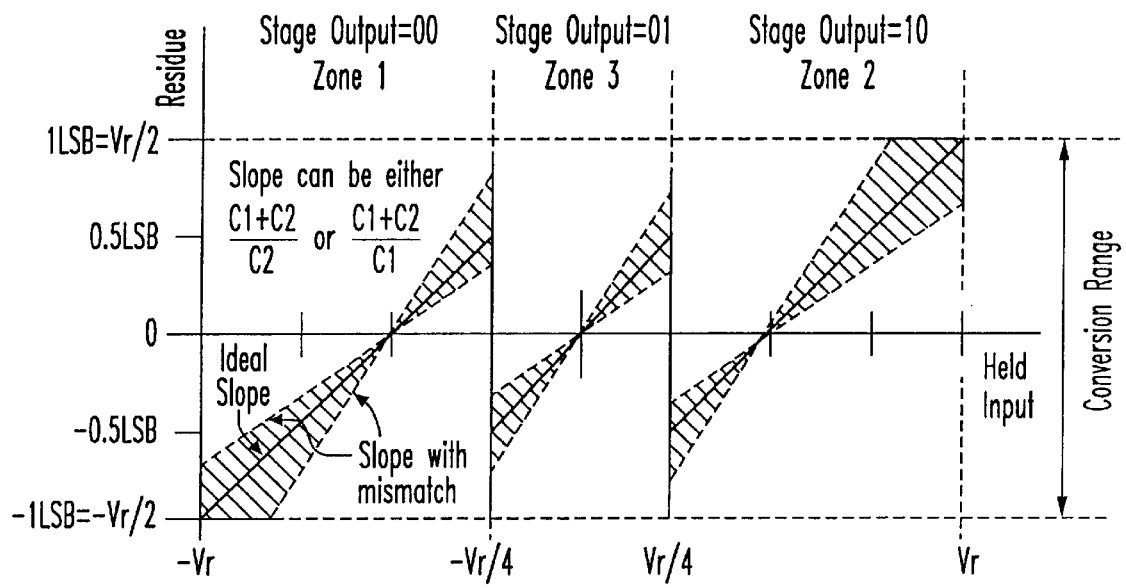
FIG. 4 is a diagram illustrating inter-stage residue as a function of stage input for a given stage of the multistage ADC of FIG. 1, with capacitor swapping in accordance with the invention to alleviate the effects of capacitor mismatch.

FIG. 4 is similar to FIGS. 2 and 3 but illustrates a case in which the gain error is reduced by randomly swapping the sampling and feedback capacitors in the manner noted above. In this case, as a result of the random swapping, the slope will be periodically switching between:

$$\frac{C1 + C2}{C2} \text{ and } \frac{C1 + C2}{C1}.$$

The advantageous effect is an averaging out of the gain error over time, such that any capacitor mismatch in the output amplifier of a given stage will produce only random error. Any harmonics previously attributable to the mismatch are broken into random noise, such that the non-linearity of the ADC is significantly reduced at the cost of a slight increase in the noise floor.

In the illustrative embodiment, where the nominal gain is two, a small mismatch between the sampling and feedback capacitors yields a gain of slightly less than two with the mismatch in one direction, and a gain of slightly more than two with the mismatch in the other direction. Therefore, if as a result of the above-described swapping each capacitor is used on average 50% of the time as a feedback capacitor and 50% of the time as a sampling capacitor, the average gain will be closer to the nominal gain of two than it would have been without the swapping.

Figure 5:
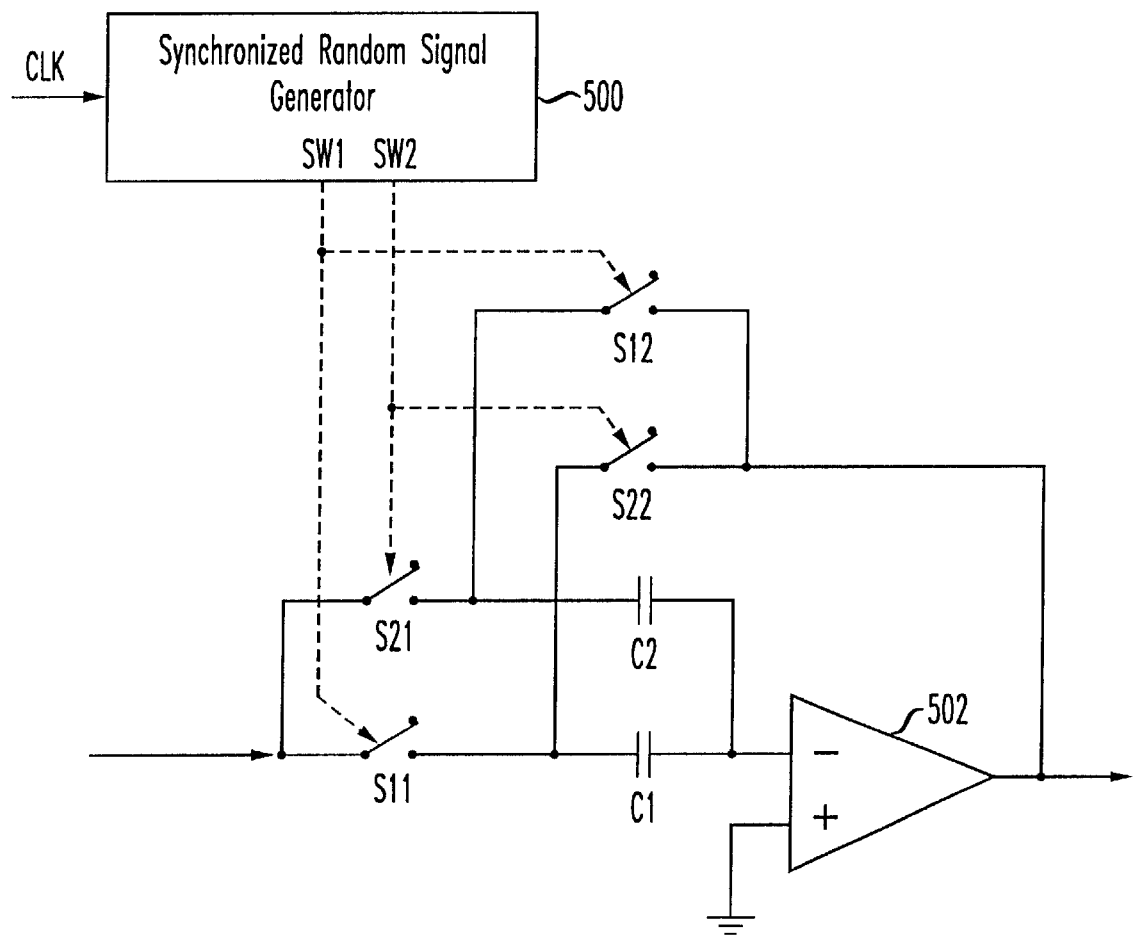
FIG. 5 shows an example of an amplifier circuit with capacitor swapping in accordance with the invention.

FIG. 5 shows an example amplifier circuit configured with the above-described random swapping of sampling and feedback components in accordance with the invention. The circuit includes a synchronized random signal generator 500, an output amplifier 502, a set of switches S11, S12, S21 and S22, and capacitors C1 and C2, all arranged as shown. A control signal for swapping the two capacitors C1 and C2 is generated by the random signal generator 500 in response to clock signal CLK. More particularly, each time the incoming clock signal CLK reaches a designated logic level, one of the output signals SW1 and SW2 is enabled and the other is disabled, in accordance with a randomly-generated output state of the generator 500, so as to control the switches associated with C1 and C2. When output SW1 is enabled, switches S11, S12 are closed and switches S21, S22 are open, such that capacitor C1 is used as a sampling capacitor and capacitor C2 is used as a feedback capacitor, and the above-noted slope is given by (C1+C2)/C2. When output SW2 is enabled, switches S21, S22 are closed and switches S11, S12 are open, such that C2 is used as a sampling capacitor and C1 is used as a feedback capacitor, and the slope is given by (C1+C2)/C1. The FIG. 5 circuit is thus configured such that the positions of the two capacitors C1 and C2 are randomly swapped, so as to provide the desirable characteristics previously shown and described in conjunction with FIG. 4.

Conventional values can be used for capacitors C1 and C2. However, since the invention alleviates the problems associated with mismatch between these components, lower values can be used than would otherwise be possible, thereby allowing higher speeds of operation.

It should be understood that although the FIG. 5 embodiment shows the swapping of sampling and feedback capacitors for only a single amplifier, similar arrangements may be used in output amplifiers and/or other amplifiers of each of the stages of the multistage ADC of FIG. 1. A separate random signal generator may be used for each of the stages or amplifiers, or a single random signal generator may generate outputs similar to signals SW1 and SW2 for each of the stages or amplifiers for which the component swapping is to be provided.

It will also be apparent to those skilled in the art that the particular circuitry shown in FIG. 5 is by way of example only, and numerous alternative arrangements of circuit elements can be used to implement the techniques of the invention. For example, other types and configurations of control and switch elements can be used.

Figure 6:
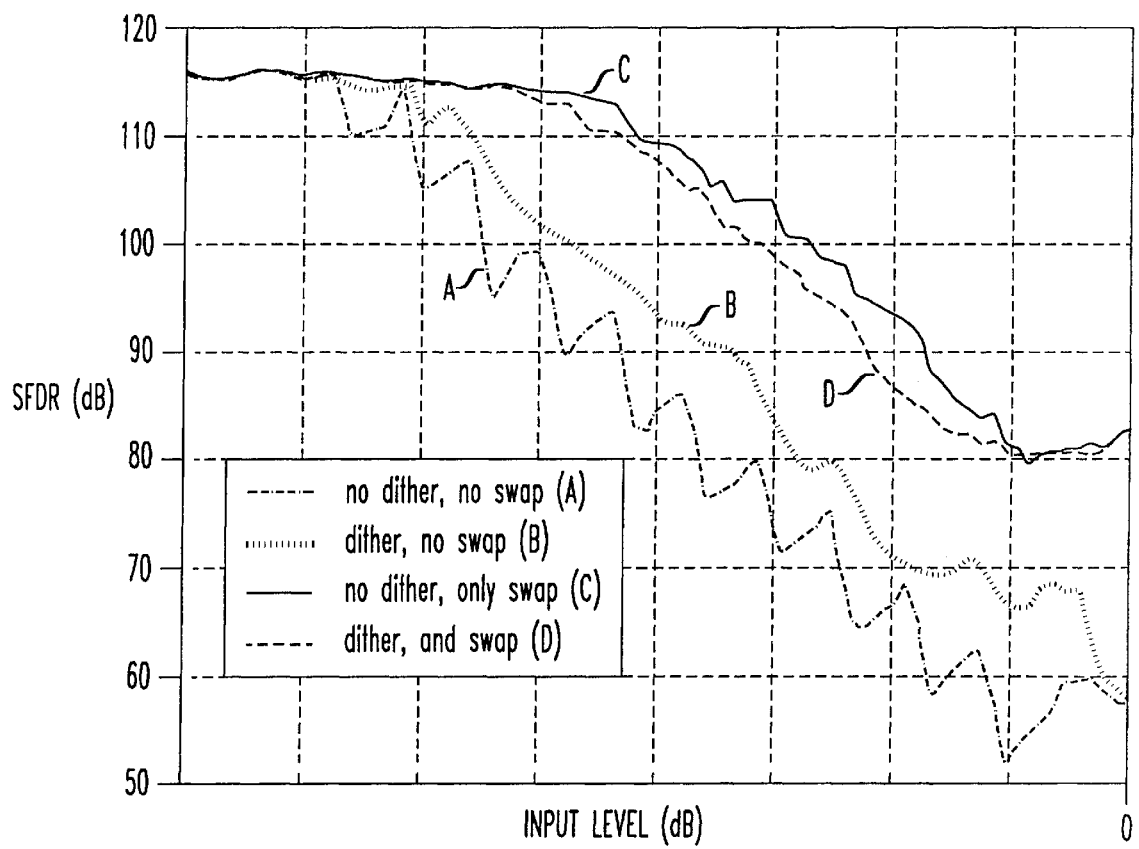
FIG. 6 is a plot of spurious free dynamic range (SFDR) as a function of input level for a number of different configurations of the multistage ADC of FIG. 1, illustrating the improvements in SFDR attributable to the present invention.

FIG. 6 is a plot of spurious free dynamic range (SFDR) as a function of input level for a number of different configurations of the multistage ADC of FIG. 1, illustrating the improvements in SFDR attributable to the present invention. The plot includes curves A, B, C and D, which correspond to the following configurations:

A No dither and no swap
B Dither with no swap
C No dither, only swap
D Dither and swap where "dither" indicates the use of non-linearity reducing dither such as that described in the above-cited U.S. Pat. No. 6,172,629, and "swap" indicates the use of random swapping of the sampling and feedback capacitors C1 and C2 in the output amplifier of each of the stages of the multistage ADC of FIG. 1 in accordance with the techniques of the invention. Each of the curves A, B, C and D shows the SFDR in decibels (dB) as a function of analog signal input level in dB. The curves are generated based on an assumption of 6 bit capacitor matching, which corresponds to a mismatch of $2^{-7}=1/128=7.8125\times10^{-3}=0.78\%$.

It can be seen from the FIG. 6 plots that the use of the capacitor swapping approach of the present invention in cases C and D provides substantial improvement over case A, corresponding to no dither and no swap, and case B, corresponding to dither with no swap. The SFDR for cases C and D is on the order of 80 dB or better even at high input levels.

As is apparent from the above, the capacitor swapping approach may be used in place of or in conjunction with known dithering techniques such as those described in the above-cited U.S. Pat. No. 6,172,629. In the example configurations for which the FIG. 6 curves were generated, curve C, corresponding to no dither and only swap, at most input levels resulted in a better SFDR than curve D, corresponding to dither with swap. In other configurations, it is possible that the combination of dither and swap may provide better performance than swap alone, particularly at high input levels.

The present invention as described herein provides a number of significant advantages over conventional techniques. For example, the invention reduces non-linearity and hence improves SFDR, particularly. More specifically, the invention in the illustrative embodiment can be used to achieve a non-linearity on the order of 14 bits, which corresponds to approximately 0.03%. The advantages are particularly significant for high input levels and in the presence of substantial component mismatch. In addition, the invention can be used to greatly reduce the size of the sampling and feedback capacitors required in a given ADC implementation, which in turn improves conversion speed and reduces silicon area. The invention can be implemented in a wide variety of multistage ADC architectures, regardless of operating frequency.

The above-described embodiments of the invention are intended to be illustrative only. For example, as indicated previously, although the invention has been illustrated in conjunction with a particular ADC architecture, alternative architectures with different numbers of output bits per stage, different types and degrees of pipelining, different types and amounts of stage output amplification, etc. may also incorporate the invention. In addition, although illustrated using the swapping of a single sampling capacitor with a single feedback capacitor of a given output amplifier, the invention can be implemented using swapping of multiple such elements, or swapping of other types of components. Furthermore, although the swapping is random in the illustrative embodiment, it is also possible to use a pseudo-random swapping or a fixed periodic swapping in other embodiments. These and numerous other alternative embodiments within the scope of the following claims will be readily apparent to those skilled in the art.

What is claimed is:

1. An analog-to-digital converter comprising:
   a sampling circuit; and
   a plurality of stages, a first one of the stages receiving a sampled analog input signal from the sampling circuit, each of at least a subset of the stages having associated therewith at least one amplifier circuit, the at least one amplifier circuit of a given one of the stages having at least one sampling component and at least one feedback component, each of the stages operating to generate outputs corresponding to one or more bits of a digital output signal representative of the analog input signal;
   a controller coupled to the at least one amplifier circuit and operative to control periodic swapping of the sampling component and the feedback component in accordance with a substantially random selection sequence in order to reduce gain error between one or more of the stages to thereby provide improved linearity for the analog-to-digital converter.

2. The analog-to-digital converter of claim 1 wherein the sampling component and the feedback component each comprise a single capacitor.

3. The analog-to-digital converter of claim 1 wherein the amplifier circuit of the given one of the stages comprises an output analog residue amplifier of the given stage.

4. The analog-to-digital converter of claim 3 wherein the output analog residue amplifier of the given stage has a gain factor on the order of two.

5. The analog-to-digital converter of claim 1 wherein the sampling component and the feedback component are periodically swapped by randomly selecting at each of a number of points in time a particular one of two available components for utilization as one of the sampling component and the feedback component, with the other of the two available components being the other of the sampling component and the feedback component.

6. The analog-to-digital converter of claim 1 wherein by periodically swapping the sampling component and the feedback component, an analog output residue as a function of analog input for the given one of the plurality of stages periodically switches between a first slope given approximately by:

$$\frac{C1+C2}{C2},$$

and a second slope given approximately by:

$$\frac{C1+C2}{C1}.$$

7. The analog-to-digital converter of claim 1 further comprising an error correction circuit having a plurality of inputs, each of the inputs coupled to a corresponding output of one of the plurality of stages, the error correction circuit being operative to generate the digital output signal representative of the analog input signal.

8. The analog-to-digital converter of claim 1 wherein the controller comprises a random signal generator operative to generate one or more control signals for controlling the periodic swapping of the sampling component and the feedback component.

9. The analog-to-digital converter of claim 8 wherein the random signal generator is synchronizable to a clock signal of the converter, such that the one or more control signals are generatable in synchronization with the clock signal.

10. The analog-to-digital converter of claim 8 wherein the random signal generator is operative to generate first and second complementary control signals, the control signals being configured for application to control inputs of switches coupled to the sampling and feedback components.

11. An integrated circuit comprising:
   at least one analog-to-digital converter, the converter comprising:

a sampling circuit; and a plurality of stages, a first one of the stages receiving a sampled analog input signal from the sampling circuit, each of at least a subset of the stages having associated therewith at least one amplifier circuit, the at least one amplifier circuit of a given one of the stages having at least one sampling component and at least one feedback component, each of the stages operating to generate outputs corresponding to one or more bits of a digital output signal representative of the analog input signal;

wherein the sampling component and the feedback component are periodically swapped in accordance with a substantially random selection sequence to reduce gain error between one or more of the stages so as to provide improved linearity for the analog-to-digital converter.

12. The integrated circuit of claim 11 wherein the sampling component and the feedback component each comprise a single capacitor.

13. The integrated circuit of claim 11 wherein the amplifier circuit of the given one of the stages comprises an output analog residue amplifier of the given stage.

14. The integrated circuit of claim 13 wherein the output analog residue amplifier of the given stage has a gain factor on the order of two.

15. The integrated circuit of claim 11 wherein the sampling component and the feedback component are periodically swapped by randomly selecting at each of a number of points in time a particular one of two available components for utilization as one of the sampling component and the feedback component, with the other of the two available components being the other of the sampling component and the feedback component.

16. The integrated circuit of claim 11 wherein by periodically swapping the sampling component and the feedback component, an analog output residue as a function of analog input for the given one of the plurality of stages periodically switches between a first slope given approximately by:

$$\frac{C1 + C2}{C2},$$

and a second slope given approximately by:

$$\frac{C1 + C2}{C1}.$$

17. The integrated circuit of claim 11 further comprising an error correction circuit having a plurality of inputs, each of the inputs coupled to a corresponding output of one of the plurality of stages, the error correction circuit being operative to generate the digital output signal representative of the analog input signal.

18. A method for improving linearity in an analog-to-digital converter, the analog-to-digital circuit comprising a sampling circuit and a plurality of stages, a first one of the stages receiving a sampled analog input signal from the sampling circuit, each of at least a subset of the stages having associated therewith at least one amplifier circuit, the at least one amplifier circuit of a given one of the stages having at least one sampling component and at least one feedback component, each of the stages operating to generate outputs corresponding to one or more bits of a digital output signal representative of the analog input signal, the method comprising the step of:

periodically swapping the sampling component and the feedback component in accordance with a substantially random selection sequence to reduce gain error between one or more of the stages so as to provide improved linearity for the analog-to-digital converter.

19. The method of claim 18 wherein the sampling component and the feedback component are periodically swapped by randomly selecting at each of a number of points in time a particular one of two available components for utilization as one of the sampling component and the feedback component, with the other of the two available components being the other of the sampling component and the feedback component.

20. The method of claim 18 wherein by periodically swapping the sampling component and the feedback component, an analog output residue as a function of analog input for the given one of the plurality of stages periodically switches between a first slope given approximately by:

$$\frac{C1 + C2}{C2},$$

and a second slope given approximately by:

$$\frac{C1 + C2}{C1}.$$

* * * * *